(12) United States Patent
Babutzka et al.

(10) Patent No.: US 6,195,261 B1
(45) Date of Patent: Feb. 27, 2001

(54) DEVICE FOR POSITIONING INTEGRATED CIRCUIT COMPONENTS THAT REQUIRE SPECIFIC SPATIAL ORIENTATION

(75) Inventors: Wilfried Babutzka, Dettingen; Oliver Bunz; Thomas Ohgke, both of Kirchheim, all of (DE)

(73) Assignee: Temic Telefunken Microelectronic GmbH, Heilbronn (DE)

( * ) Notice: Subject to any disclaimer, the term of this patent is extended or adjusted under 35 U.S.C. 154(b) by 0 days.

(21) Appl. No.: 09/076,727

(22) Filed: May 13, 1998

(30) Foreign Application Priority Data

May 14, 1997 (DE) .............................. 197 20 106

(51) Int. Cl.$^7$ .................................. H05K 7/02
(52) U.S. Cl. .................. 361/752; 361/749; 361/767; 361/784; 361/789; 361/796; 361/803; 174/254; 439/67; 73/493; 73/514.33
(58) Field of Search ................... 174/254, 261; 257/678, 679, 700, 723, 724, 747; 361/736, 749, 784, 789, 803, 826, 827; 439/67, 77, 76.1, 76.2; 365/51, 52, 63; 362/3; 359/FOR 124, FOR 125; 396/542, 535; 348/373, 374; 235/462.11, 462.43; 250/239; 73/493, 514.01, 514.33

(56) References Cited

U.S. PATENT DOCUMENTS

| | | | |
|---|---|---|---|
| 3,766,439 | 10/1973 | Isaacson | 361/714 |
| 4,494,854 | * 1/1985 | Yamaga et al. | 396/535 |
| 4,591,901 | * 5/1986 | Andrevski | 348/374 |
| 4,843,520 | 6/1989 | Nakatani et all. | 361/739 |
| 4,922,199 | * 5/1990 | Fukui et al. | 361/749 |
| 5,204,806 | * 4/1993 | Sasaki et al. | 361/749 |
| 5,220,198 | * 6/1993 | Tsuji | 257/723 |
| 5,275,048 | * 1/1994 | Hulsing, II et al. | 73/514.01 |
| 5,555,159 | * 9/1996 | Dore | 361/796 |
| 5,777,850 | 7/1998 | Jakob et al. | 361/736 |
| 5,789,815 | * 8/1998 | Tessier et al. | 361/749 |
| 5,926,369 | * 7/1999 | Ingraham et al. | 361/749 |

FOREIGN PATENT DOCUMENTS

| | | |
|---|---|---|
| 1888644 | * 12/1963 | (DE) . |
| 4035526A1 | * 5/1992 | (DE) . |
| 4322034A1 | * 2/1994 | (DE) . |
| 43 03 908 A1 | 8/1994 | (DE) . |
| 4429983C1 | * 11/1995 | (DE) . |
| 1790126C2 | * 7/1996 | (DE) . |
| 0 388 150 | 10/1989 | (EP) . |
| 0386279A1 | * 9/1990 | (EP) . |
| 90/06609 | 6/1990 | (WO) . |

* cited by examiner

Primary Examiner—Jeffrey Gaffin
Assistant Examiner—John B. Vigushin
(74) Attorney, Agent, or Firm—Venable; Norman N. Kunitz

(57) ABSTRACT

Various devices are known for positioning and aligning direction-sensitive components. It is a disadvantage with these devices that either additional mechanical aids are required or in each case only one component is aligned and positioned in the housing. In the device according to the invention, a movable or elastic printed circuit board is attached to a housing which is shaped in such a way that the direction-sensitive components, modules or function groups affixed to the printed circuit board are positioned and aligned. With this device, even more than one direction-dependent component can be positioned in a housing by simple means and at low cost.

12 Claims, 2 Drawing Sheets

DEVICE FOR POSITIONING INTEGRATED CIRCUIT COMPONENTS THAT REQUIRE SPECIFIC SPATIAL ORIENTATION

BACKGROUND OF THE INVENTION

The invention relates to a device for mounting at least one electronic component, which requires a specific spatial orientation, in a required plane and/or orientation.

In many applications, the correct and spatially accurate mounting of components in a housing is of great significance. The functioning and characteristics of such components, which consist of a single component or, with several components, make up function groups or modules, are direction-dependent. This is true, for example, in the case of acceleration sensors which must register an acceleration signal in a specific spatial direction or plane. Acceleration sensors of this kind must therefore be aligned in such a way that they register the acceleration signal in the desired direction. The location in the housing is also of great significance in the case of other components such as, for example, optoelectronic receivers or transmitters that receive a signal from or send a signal in a defined direction or that are to display something at a specific place. If the place required for this purpose is not situated directly on the printed circuit board that acts as carrier for the electrical and electronic components, then additional mechanical and electrical devices are required which then position the direction-dependent component in the preferred plane and/or direction.

Various devices are known that accurately position and align the components. One device comprises a printed circuit board with additional mechanical carriers in the form of spacers, angle elements, etc. The components are positioned and aligned on the printed circuit board using these auxiliary means. Another method positions the entire housing with the carrier in the desired position on a unit, in particular a motor vehicle.

These devices have disadvantages, however. On the one hand they are very elaborate and on the other hand they permit positioning in one direction only. Also, in the devices of a previously conventional kind, additional carriers are required. Furthermore, the components in one and the same housing can be aligned on a single plane only with these devices.

In addition, movable or elastic carrier materials are known, in particular printed circuit boards. These flexible printed circuit boards are used wherever a space-saving construction is needed or the elastic printed circuit board must be adapted to the circumstances relating to the housing.

SUMMARY OF THE INVENTION

The object of the invention is to provide a device of the kind mentioned at the outset which permits simple and various positioning of components and which requires no auxiliary means.

According to the invention the component is placed on a carrier which is at least partially movable and/or flexible and which at the same time serves as printed circuit board. This carrier is then placed directly on a mounting surface of the housing, this mounting surface being so formed that the direction-dependent component is positioned and aligned on it and the carrier consequently projects into several planes.

The advantages provided by the invention are that the component is always put into the precise position on account of the carrier that fits snugly on the housing. The requirements for doing this are very few and call only for a printed circuit board that is at least partially movable and a housing that has been adapted to suit the needs. Since the housing parts are generally made by a casting process, the shape of the wall or another mounting surface is irrelevant. Furthermore, various acceleration sensors, for example, can be fitted with identical carriers mounted in housings of different shape.

Additional advantageous further developments are covered by the Subclaims. The method is described here with different materials that allow a particularly simple embodiment. It is furthermore possible in this device to put several direction-dependent components into the correct position in a housing in one operation.

BRIEF DESCRIPTION OF THE DRAWINGS

The invention will now be described in connection with the drawings with reference to examples of embodiment.

DESCRIPTION OF THE PREFERRED EMBODIMENTS

Figure 1A:
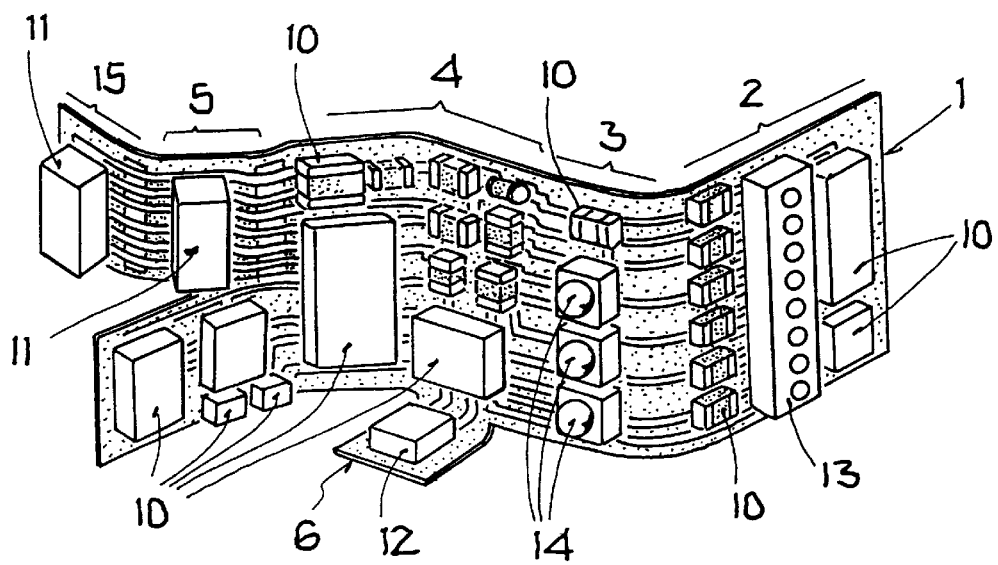
FIG. 1a: Elastic carrier

FIG. 1a shows a carrier 1 that can be used for the simple method for spatially positioning or aligning. The depicted carrier 1 has the task of not only allowing the components 10, 11, 12, 13, 14 to be attached to it but also it provides the electrical connection between the various components. In the simplest case, the carrier can be described as printed circuit board. In this example of application it consists of an elastic material. Various flexible materials can be used such as, for example, this flexible polyimide or FR4 that adapts to the housing or mounting surfaces and fits snugly without damaging the leads and causing the components mounted on it to become detached. This carrier has both direction-dependent components 11, 12, 13, 14 and also active or passive direction-independent components 10. These components are mounted on the various carrier sections 2, 3, 4, 5, 6 and 15.

Figure 1B:
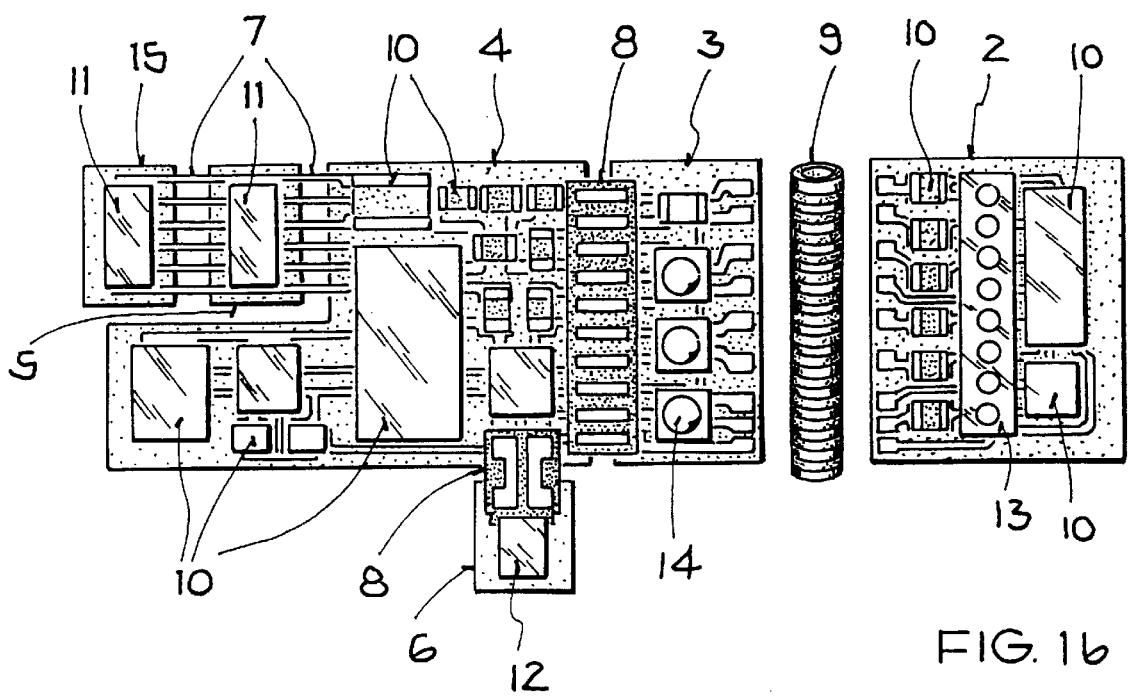
FIG. 1b: Rigid carrier with movable devices

FIG. 1b shows a rigid printed circuit board 1 which has hinged-type devices 7, 8, 9. The rigid or solid material, for example rigid FR4, can be made flexible by means of the hinged-type devices 7, 8, 9. So-called "flying leads" 7 can be used to provide the electrical and flexible connection between the individual partial zones. Another possibility for achieving flexibility is by using so-called "rigid-flexible-rigid" connections. These connections can consist of two rigid connections joined through, for example, a flexible foil 8 or by a flexible ribbon cable. Another hinged-type device connecting together the individual printed circuit board zones 2, 3, 4, 5, 6, 15 mechanically and electrically consists of a cylindrical device 9 which has printed conductors all round so that the printed circuit boards remain connected electrically when movement takes place around the cylinder. Components 10, 11, 12, 13, 14 can be placed fully automatically by very simple means and precisely on printed circuit boards 1 of this kind when they are planar, that is when all partial zones 2, 3, 4, 5, 6, 15 are in the same plane. A low cost construction is thereby ensured. This carrier also has active or passive direction-independent components 10. These components are also mounted on the carrier and connected together electrically.

The components 10, 11, 12, 13 and 14 are also placed fully automatically in one plane on the carrier described in FIGS. 1a and 1b.

Figure 2:
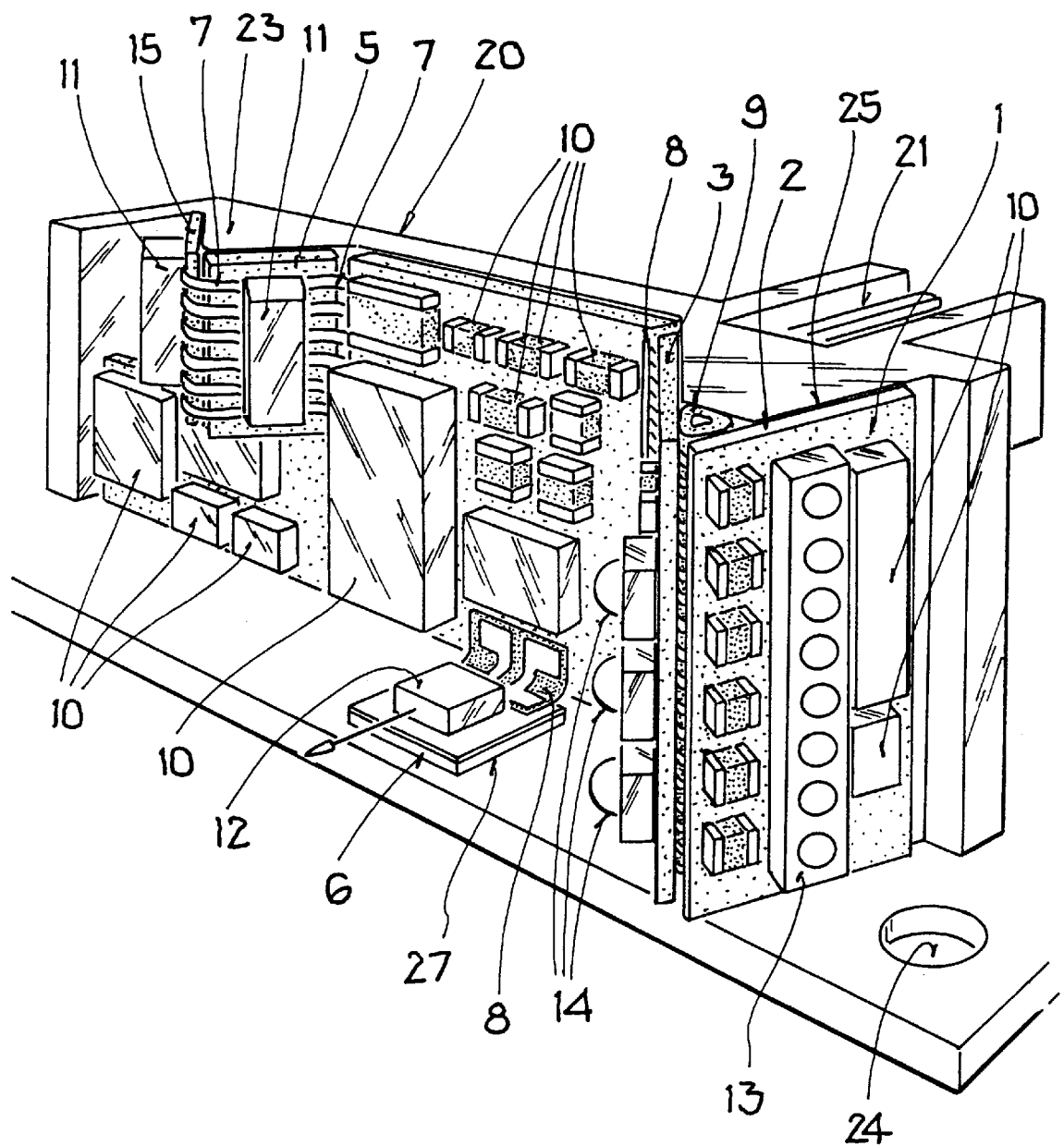
FIG. 2: Housing with carrier

FIG. 2 shows an application example designed in accordance with the method described by the invention. The carrier 1 described in FIG. 1b has been fitted in a housing 20. Because of the special shape of the housing 20 at points 23, 24, 25, 27, 28 the direction-dependent components 11, 12, 13, 14 have consequently been positioned and aligned. The carrier, in this application example the printed circuit board 1, is placed in the housing 20. On placing or when mounting with special tools that allow precise positioning, the printed circuit board fits snugly to the walls or mounting surfaces 23, 24, 25, 26, 27, 28 of housing 20. In the application example, the walls 23, 24, 25, 28 have slopes. The slopes 23, 24, 25, 28, the printed circuit board 1 and the position of the directiondependent component 11, 12, 13, 14 on the printed circuit board are calculated or designed beforehand such that when the printed circuit board is mounted on this wall then the component is positioned and aligned. Furthermore, the location of the hinged-type devices 7, 8, 9 on the rigid printed circuit board 1 or an elastic printed circuit board must be allowed for in the overall design. These devices 7, 8, 9 that make the printed circuit board 1 flexible allow the intrinsically rigid printed circuit board 1 to fit snugly on the housing 20. Not shown in the drawing is the variant in which the carrier or the printed circuit board is made of a flexible material as described in FIG. 1a and which retains all functions on bending, that is, for example, printed conductors are not damaged, components do not snap off. On mounting the printed circuit board 1 in housing 20 these are permanently joined together so that it is no longer possible for them to slip apart. Fasteners such as clips and screws, for example, can be used to affix. The printed circuit board can also be fixed by adhesion, soldering or clamping.

In the example of embodiment shown here, the printed circuit board consists of several partial zones 2, 3, 4, 5, 15 and 6 joined together in a manner that keeps them flexible. The partial zones are shaped in such a way that when the printed circuit board is fitted a direction-dependent component is correctly positioned. If the printed circuit board zone 5 is affixed to the housing slope 23, the piezoresistive acceleration sensor 11, for example, is automatically positioned correctly in the desired direction x. This also applies to the other acceleration sensor 11 on the printed circuit board part 15 which is affixed to the other housing slope 28. The acceleration sensors are connected to the remainder of the printed circuit board by means of printed conductors. The flexible, movable device 7 allows the part piece 5 to move relative to the part piece 4 so that the surfaces are no longer in one and the same plane. The printed circuit board part piece 4 with the components on it is affixed level on the housing wall 26. The printed circuit board part piece 6 is moved out of the plane of the printed circuit board part piece 4 and then fitted to the housing base 27. This causes the laser, which is located on this part piece, to be positioned and aligned. The printed circuit board part piece 3 is then rotated into another plane over a flexible foil, that connects the two partial zones together electrically, in such a way that it is fitted on the housing slope 24. In the process, a receiver 14 is aligned in the y axis. Finally, the part piece 2 is rotated out of the previous plane over the flying leads and aligned on the adjoining housing slope 25 causing a row of LEDs 13 to be positioned in order, for example, to act as a status indicator on a cover. In this application example, the printed circuit board is contacted with the connector 21. The contacting points cannot be seen in the Figure. Finally, after closing it, the housing equipped in this way is attached to the motor vehicle, for example, or to another device, by means of the mounting holes 22.

The purpose of FIG. 2 is to show that the housing is required not only to protect the components but at the same time, when using the movable or flexible printed circuit boards described above, to position and align components or function groups. It is immaterial here whether the direction-dependent component is to be aligned only to a direction in space, as for example in the case of the acceleration sensors, or to a point, as for example in the case of the laser.

In another application, which is not illustrated, a piezoresistive acceleration sensor can be affixed to the movable printed circuit board or elastic foil. This allows accelerations to be measured in order to trip safety devices. In addition, other active and passive components are fitted to this carrier in order to process the acceleration signal. As described in FIG. 2, this carrier is placed in a housing and represents an acceleration meter. The circuit and the components for measuring and evaluating the acceleration signal on the carrier are always independent of the spatial plane in which the acceleration is to be measured and independent of the motor vehicle which specifies different mounting locations for the acceleration meter for different vehicle types. The alignment of the acceleration sensor in the housing depends on the main sensitivity axis and on the attachment of the housing on the motor vehicle. With the device described under FIG. 2 it is possible to cover various applications with one and the same movable printed board assembly or flexible foil. The adaptation to the main sensitivity axis required in each particular case, to the mounting on the motor vehicle and/or to the motor vehicle type is performed simply by the housing shape or another mounting surface to which the carrier, in particular the printed circuit board or the elastic foil, is affixed. Various acceleration meters can be provided with one and the same carrier. The method described here allows different acceleration meters to be built simply and at low cost for different applications and main sensitivity axes.

Furthermore, the carrier is used in all applications to connect the components mechanically and electrically and therefore satisfies several requirements at one and the same time.

What is claimed is:

1. A device for mounting electrical components that require a particular spatial orientation, comprising:
   a carrier that is at least one of partially movable and partially flexible;
   at least one electrical component that requires a specific spatial orientation and is mounted on the carrier; and
   a housing including a plurality of mounting surfaces, the mounting surfaces shaped and oriented such that when the carrier bearing the electrical component is joined to the mounting surfaces, then the electrical components will be located in the required spatial orientation.

2. A device in accordance with claim 1, wherein the component is mounted as one of a single component, as a function group and as a module on the carrier.

3. A device in accordance with claim 1, wherein the carrier that is at least one of partially movable and partially flexible is made of at least one of:
   a thin, flexible polymer or another flexible material;
   a rigid material with flying leads; and
   a rigid-flexible-rigid connection in which a rigid carrier part is connected to another rigid part through a flexible or hinged-type connection.

4. A device in accordance with claim 1, wherein a plurality of direction-dependent components are mounted on the carrier and positioned in various orientations.

5. A device in accordance with claim 1, wherein the electrical component that requires a specific spatial orientation is an acceleration meter mounted in a specific location in a motor vehicle and measures a kinetic variable in a preferred plane.

6. A device in accordance with claim 1, wherein the electrical component is an acceleration sensor and is mounted as one of: (1) a single component, (2) a function group and (3) a module on the carrier.

7. A device for mounting electrical components that require a particular spatial orientation, comprising:
- a carrier that is at least one of partially movable and partially flexible;
- at least one electrical component that requires a specific spatial orientation and is mounted on the carrier;
- a housing including a plurality of mounting surfaces; and
- means for mounting the carrier to the mounting surfaces such that the electrical components located on the carrier are in the required spatial orientation.

8. A device in accordance with claim 7, wherein the component is mounted as one of: (1) a single component, (2) a function group and (3) a module on the carrier.

9. A device in accordance with claim 7, wherein the electrical component is an acceleration sensor and is mounted as one of: (1) a single component, (2) a function group and (3) a module on the carrier.

10. A device in accordance with claim 7, wherein the carrier that is at least one of partially movable and partially flexible is made of at least one of:
- a thin, flexible polymer or another flexible material;
- a rigid material with flying leads; and
- a rigid-flexible-rigid connection in which a rigid carrier part is connected to another rigid part through a flexible or hinged-type connection.

11. A device in accordance with claim 7, wherein a plurality of direction-dependent components are mounted on the carrier and positioned in various orientations.

12. A device in accordance with claim 7, wherein the electrical component that requires a specific spatial orientation is an acceleration meter mounted in a specific location in a motor vehicle and measures a kinetic variable in a preferred plane.

* * * * *